(12) United States Patent
Liu et al.

(10) Patent No.: US 11,098,249 B2
(45) Date of Patent: Aug. 24, 2021

(54) PHOSPHOR, PREPARATION METHOD FOR PHOSPHOR, AND LIGHT EMITTING DEVICE HAVING PHOSPHOR

(71) Applicant: GRIREM ADVANCED MATERIALS CO., LTD., Beijing (CN)

(72) Inventors: Ronghui Liu, Beijing (CN); Weidong Zhuang, Beijing (CN); Fu Du, Beijing (CN); Yuanhong Liu, Beijing (CN); Wei Gao, Beijing (CN); Xia Zhang, Beijing (CN); Huibing Xu, Beijing (CN); Chunpei Yan, Beijing (CN); Xiaowei Zhang, Beijing (CN)

(73) Assignee: GRIREM ADVANCED MATERIALS CO., LTD., Beijing (CN)

( * ) Notice: Subject to any disclaimer, the term of this patent is extended or adjusted under 35 U.S.C. 154(b) by 249 days.

(21) Appl. No.: 16/313,883

(22) PCT Filed: Jun. 30, 2017

(86) PCT No.: PCT/CN2017/091238
§ 371 (c)(1),
(2) Date: Dec. 27, 2018

(87) PCT Pub. No.: WO2018/001369
PCT Pub. Date: Jan. 4, 2018

(65) Prior Publication Data
US 2019/0153316 A1 May 23, 2019

(30) Foreign Application Priority Data

Jun. 30, 2016 (CN) .......................... 201610509465.9

(51) Int. Cl.
| | |
|---|---|
| C09K 11/77 | (2006.01) |
| H01L 33/50 | (2010.01) |
| F21K 9/64 | (2016.01) |
| C09K 11/08 | (2006.01) |

(52) U.S. Cl.
CPC ...... *C09K 11/7766* (2013.01); *C09K 11/0883* (2013.01); *C09K 11/7774* (2013.01); *C09K 11/77747* (2021.01); *F21K 9/64* (2016.08); *H01L 33/50* (2013.01); *H01L 33/502* (2013.01); *H01L 2933/0041* (2013.01)

(58) Field of Classification Search
CPC ............ C09K 11/7766; C09K 11/7774; C09K 11/0883; H01L 33/502
See application file for complete search history.

(56) References Cited

U.S. PATENT DOCUMENTS

| | | | | |
|---|---|---|---|---|
| 7,321,191 | B2 * | 1/2008 | Setlur ................ | C09K 11/7734 252/301.16 |
| 8,113,675 | B2 * | 2/2012 | Bechtel ............... | H01L 25/0753 362/84 |
| 8,226,263 | B2 * | 7/2012 | Van Woudenberg ........................ | G02F 1/133603 362/231 |
| 9,034,207 | B2 | 5/2015 | Won et al. | |
| 9,062,253 | B2 * | 6/2015 | Won .................... | C09K 11/7792 |
| 9,155,146 | B2 * | 10/2015 | Lee ......................... | H05B 45/46 |
| 9,391,250 | B2 * | 7/2016 | Im ........................... | H01L 33/62 |
| 10,214,429 | B2 * | 2/2019 | Nitta ..................... | F21S 41/176 |
| 2008/0203892 | A1 * | 8/2008 | Schmidt ............. | C09K 11/0883 313/486 |
| 2014/0321099 | A1 | 10/2014 | Kaide et al. | |
| 2016/0040063 | A1 * | 2/2016 | Shimooka .......... | C09K 11/0883 257/98 |

FOREIGN PATENT DOCUMENTS

| | | |
|---|---|---|
| CN | 102361956 A | 2/2012 |
| CN | 104981532 A | 10/2015 |
| CN | 105255493 A | 1/2016 |

OTHER PUBLICATIONS

International Search Report for PCT/CN2017/091238 dated Aug. 30, 2017, ISA/CN.

* cited by examiner

*Primary Examiner* — C Melissa Koslow
(74) *Attorney, Agent, or Firm* — Dragon Sun Law Firm, PC; Jinggao Li, Esq.

(57) ABSTRACT

Phosphor, a preparation method for the phosphor, and a light emitting device having the phosphor. The phosphor comprises an inorganic compound which at least comprises an element M, an element A, an element D, and an element R; the element M is one or two elements selected from the group consisting of Lu, La, Pr, Nd, Sm, Y, Tb, and Gd and must comprise Lu; the element A is Si and/or Ge; the element D is one or two elements selected from the group consisting of O, N, and F and must comprise N; the element R is Ce and/or Dy. Since the ionic radius of Lu3+ is smaller than that of La3+, when the inorganic compound comprises element Lu, the original ligand site would be contracted. In order to reduce lattice distortion due to the ligand site contraction, the adjacent ligand site expands, and the photochromic property is adjusted.

13 Claims, 1 Drawing Sheet

Figure 1:
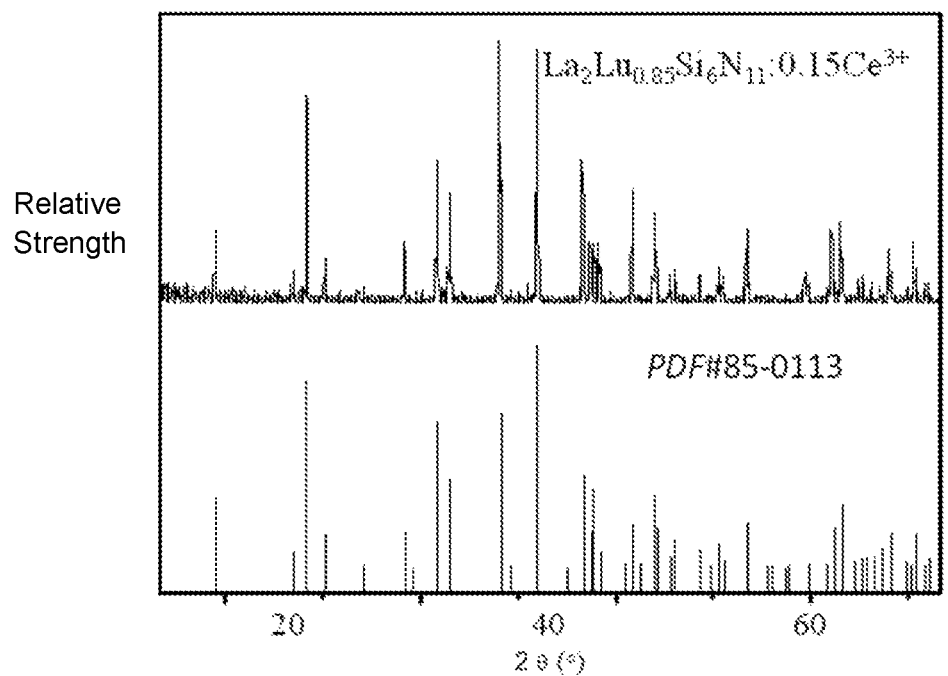

PHOSPHOR, PREPARATION METHOD FOR PHOSPHOR, AND LIGHT EMITTING DEVICE HAVING PHOSPHOR

The present application is a U.S. National Phase application based upon PCT Application No. PCT/CN2017/091238 filed on Jun. 30, 2017 which claims priority to Chinese patent application No. 201610509465.9, titled "Phosphor, Preparation Method for Phosphor, and Light Emitting Device Having Phosphor", filed with the Chinese State Intellectual Property Office on Jun. 30, 2016, the entire disclosures of which are incorporated herein by reference.

FIELD OF THE INVENTION

The present invention relates to the technical field of fluorescent materials, and particularly, to a phosphor, a preparation method therefor, and a light emitting device having the phosphor.

BACKGROUND OF THE INVENTION

White LED being a novel green solid light source, compared with the conventional incandescent lamp, the fluorescent light source has the advantages of highly effective light emission, low power consumption, long use life, few heat emission, small volume, resistance to damage, quick response, and environment-friendliness, and has found successful applications in the fields of semiconductor lighting and liquid crystal backlight display.

Currently, the mainstream embodiment scheme of white LED is to allocate the blue LED chip with a phosphor with various emission wavelengths, the phosphor being the critical factor that decides the light emission efficiency of the white LED device, particularly such performances as the chromatic temperature and the color rendering index. Yellow phosphor and yellow-green phosphor of the aluminate series are currently the most mature phosphor systems, occupying more than 70% market capacity.

High-power white LED, laser lighting and display are the important development tendency in the future, so higher demand is put on the stability of the phosphors matched therewith, but the thermal stability of the aluminate-series phosphors are no longer able to meet the requirements of high-density energy excitation. The Japanese Mitsubishi Chemical Corporation has invented a novel nitride phosphor, whose stability is better than that of the aluminate-series phosphors—see for details patent documents with publication numbers CN101663372A and CN102361956A.

However, the emission spectrum of the nitride phosphor provided by the aforementioned patent documents is difficultly adjustable, so it is hard to flexibly adjust its photochromic property according to needs, and this in turn restricts its application.

SUMMARY OF THE INVENTION

The main objective of the present invention is to provide a phosphor, a preparation method therefor, and a light emitting device having the phosphor, so as to address the prior-art problem of difficult adjustability of phosphor emission spectrum.

In order to achieve the above objective, according to one aspect of the present invention, there is provided a phosphor comprising an inorganic compound, which at least comprises an element M, an element A, an element D, and an element R, of which the element M is one or two elements selected from the group consisting of Lu, La, Pr, Nd, Sm, Y, Tb, and Gd and must comprise Lu; the element A is Si and/or Ge; the element D is one or two elements selected from the group consisting of O, N, and F and must comprise N; the element R is Ce and/or Dy.

Further, the element Lu has a mole ratio of 1 to 50% in the element M, and the inorganic compound has a crystal structure the same as $La_3Si_6N_{11}$.

Further, the inorganic compound has a composition of $M_{3-a}A_xD_y{:}aR$, in which parameters a, x and y satisfy the following conditions: $0<a\leq0.8$, $5\leq x\leq 7$, $10\leq y\leq 12$.

Further, the element Lu has a mole ratio of 1 to 40%, preferably 15 to 35%, in the element M.

Further, the element A is Si.

Further, the element D is N.

Further, the element R is Ce or a combination of Ce with Dy.

Further, $0.1\leq a\leq 0.5$; $5.5\leq x\leq 6.5$, preferably $x=6$; $10.5\leq y\leq 11.5$, preferably $y=11$.

Further, the element M comprises elements Lu and La, preferably, a sum of mole numbers of the elements Lu and La is from 80 to 100% in the mole number of the element M.

Further, the phosphor has a peak wavelength of excitation spectrum at 420 to 460 nm, and can emit a peak wavelength covering the range between 515 to 540 nm.

According to another aspect of the present invention, there is provided a light emitting device comprising a fluorescent substance and an excitation light source, of which the fluorescent substance comprises the aforementioned phosphor.

Further, the excitation light source is a semiconductor light emitting diode or a laser light source, preferably, the excitation light source has an emission peak wavelength of 400 to 490 nm.

Further, the fluorescent substance further comprises another/other phosphor(s) selected from the group consisting of any one or more of $(Y,Gd,Lu,Tb)_3(Al,Ga)_5O_{12}{:}Ce^{3+}$, $\beta$-SiAlON:$Eu^{2+}$, $(Ca,Sr)AlSiN_3{:}Eu^{2+}$, $(Li,Na,K)_2(Ti,Zr,Si,Ge)F_6{:}Mn^{4+}$ and $(Ca,Sr,Ba)MgAl_{10}O_{17}{:}Eu^{2+}$. According to yet another aspect of the present invention, there is provided a method for preparing the aforementioned phosphor, which method comprises step 1)—using a simple substance, a nitride, an oxide selected from an element M, an element A, an element D and an element R or an alloy thereof as source materials, and mixing the source materials to obtain a mixture; step 2)—placing the mixture into a container and calcinating the same in nitrogen or other non-oxidizing conditions to obtain a calcinated product, wherein the highest sintering temperature is from 1500 to 2000° C., and the holding time is 5 to 20 hours; and step 3)—sequentially subjecting the calcinated product to crushing, washing, sieving and baking processes to obtain the phosphor. The "baking" step is a common technical means in the prior art which means "drying", such as U.S. Pat. No. 9,399,731 (see column 2, lines 31-37), U.S. Pat. No. 9,337,399 (see column 5, lines 61-67), and U.S. Pat. No. 9,231,150 (see column 6, lines 6-15).

Further, the source materials are weighted and taken according to mole ratios of the elements in the chemical formula $M_{3-a}A_xD_y{:}aR$.

According to the technical solutions of the present invention, since the ionic radius of $Lu^{3+}$ is smaller than that of $La^{3+}$, when the inorganic compound forming the phosphor comprises element Lu, the original ligand site would be contracted; in order to reduce lattice distortion due to the ligand site contraction, the adjacent ligand site expands, and this weakens the existing crystal field environment, so that the emission spectrum of the phosphor having the inorganic compound can be easily adjusted—even adjusted to the green light region, and therefore its photochromic property can be flexibly adjusted according to needs; furthermore, its thermal stability is relatively good to the extent that the need for high-density energy excitation can be satisfied.

EXPLANATIONS OF THE ACCOMPANYING DRAWINGS

Figure 2:
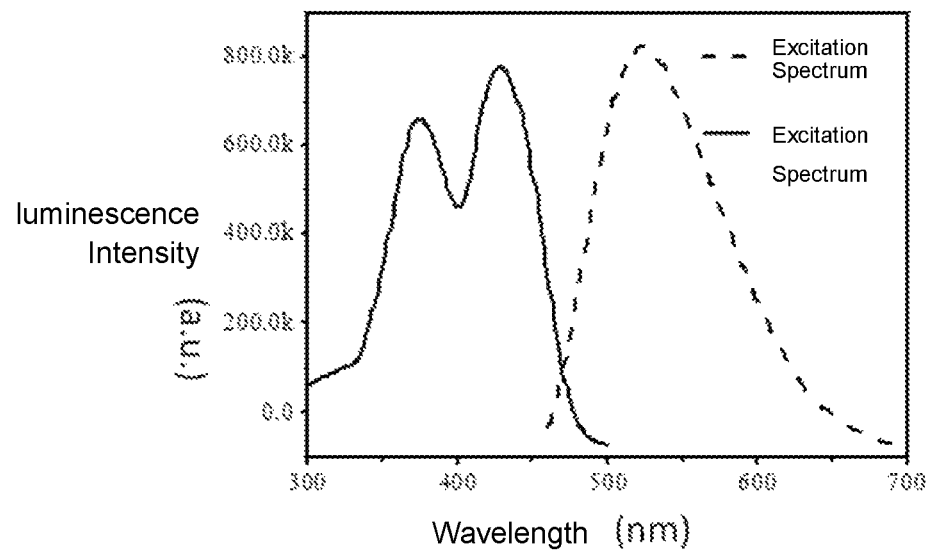

The drawings accompanying the Description that constitutes a part of the present application is used to provide further comprehension of the present invention. The exemplary examples of the present invention and the explanations thereof are meant to explain the present invention, but should not be so construed as to restrict the present invention. In the drawings:

FIG. 1 illustrates XRD diffraction patterns of the phosphor according to Example 1 of the present invention; and FIG. 2 illustrates excitation spectrum and emission spectrum of the phosphor according to Example 1 of the present invention.

SPECIFIC EXAMPLES

As should be noted, under the circumstance of not being conflictive, examples and features in the Examples of the present application can be mutually combined. The present invention will be described in detail below in conjunction with the Examples.

As has been noted in the Background Art, although currently available nitride phosphor is rather good in terms of thermal stability, its emission spectrum is difficultly adjustable, so it is hard to flexibly adjust its photochromic property according to needs, and this in turn restricts its application. In order to address the above problem, the present application provides a phosphor, a preparation method therefor, and a light emitting device having the phosphor.

In a typical example of the present application there is provided a phosphor comprising an inorganic compound, which at least comprises an element M, an element A, an element D, and an element R. The element M is one or two elements selected from the group consisting of Lu, La, Pr, Nd, Sm, Y, Tb, and Gd and must comprise Lu; the element A is Si and/or Ge; the element D is one or two elements selected from the group consisting of O, N, and F and must comprise N; the element R is Ce and/or Dy.

The inorganic compound is used as a constituent part of the phosphor or used as the phosphor per se, so based on comprising the above elements its composition has the crystal structure suitable for forming a phosphor, or it can be understood thus that the aforementioned elements are utilized to substitute corresponding elements of the inorganic compound forming the existing phosphor—for instance, the element M is used to substitute a corresponding lanthanide element. The following theoretic explanation is made all on the basis of having the crystal structure of a phosphor. Since the ionic radius of $Lu^{3+}$ is smaller than that of $La^{3+}$, when the inorganic compound forming the phosphor comprises element Lu, the original ligand site would be contracted; in order to reduce lattice distortion due to the ligand site contraction, the adjacent ligand site expands, and this weakens the existing crystal field environment, so that the emission spectrum of the phosphor having the inorganic compound can be easily adjusted,—even adjusted to the green light region, and therefore its photochromic property can be flexibly adjusted according to needs; furthermore, its thermal stability is relatively good to the extent that the need for high-density energy excitation can be satisfied.

Out of the above theoretical consideration, the element Lu has a mole ratio of 1 to 50% in the element M; with the increase in the content of the Lu element, blue shift or red shift of the emission spectrum of the phosphor is increasingly apparent in the above inorganic compound, so phosphors with different photochromic properties can be obtained. Moreover, the inorganic compound has a crystal structure the same as $La_3Si_6N_{11}$, which is a tetragonal system having a space group of P4bm. Under the circumstance the excellent temperature property of the $La_3Si_6N_{11}$:$Ce^{3+}$ phosphor is guaranteed, the phosphor having such crystal structure can be adjusted as to its spectrum peak wavelength from the originally fixed 535 nm to 515 nm.

In a preferred example of the present application, in order that the phase of the inorganic compound according to the present application is relatively pure, the inorganic compound preferably has a composition of $M_{3-a}A_xD_y$:aR, wherein parameters a, x and y satisfy the following conditions: $0<a\leq0.8$, $5\leq x\leq 7$, $10\leq y\leq 12$. If the relative contents of A and D vary relatively greatly, the crystal structure of the target product might be changed, so the contents of A and D are optimized to facilitate that the contents of main produced phases of the inorganic compound formed as mentioned above are more while the contents of impurity phases are less, thus guaranteeing that the main phase produced is of the target structure needed, and this is conducive to enhancing the light emission property.

Further, the element Lu has a mole ratio of 1 to 40%, preferably 15 to 35%, in the element M.

In another preferred example of the present application, the element A is Si. It is further preferred that the element D is N. It is more preferred that the element R is Ce or a combination of Ce with Dy.

When the element R is Ce in the inorganic compound, activator ions $Ce^{3+}$ in $La_3Si_6N_{11}$ mostly substitute $La_2$ lattice sites, while $La_1$ lattice sites adjacent $La_2$ are less substituted—in other words, there is a phenomenon that $Ce^{3+}$ has preferential site occupation in the matrix; $La_1$ and $La_2$ have relatively similar coordination environments, as both are joined with 8 Ns, and their average bond lengths are nearly the same, with the atomic ratio $La_1:La_2=2:1$ in a single cell; since the atomic quantities of $La_1$ are by far greater than those of $La_2$, after $Lu^{3+}$ with short ionic radii substitute partial $La^{3+}$, $Lu^{3+}$ mainly substitute $La_1$, however, since the difference in ionic radii, the ligand site of $La_1$ would contract; in order to reduce lattice distortion as far as possible, the adjacent $La_2$ ligand site expands; concerning the expanding $La_2$ ligand site, since $Ce^{3+}$ mainly occupy $La_2$ lattice sites, ligands adjacent $Ce^{3+}$ ions also expand, which weakens the adjacent crystal field environment, and this finally leads to weakening of 5d energy level splitting of $Ce^{3+}$, so that the spectrum of the inorganic compound varies with variation of the doping quantity of Lu, whereby the spectrum of the above-structured inorganic compound is easily adjustable, so as to achieve adjustment of the photochromic property. At the same time, the 5d energy level splitting of $Ce^{3+}$ linearly varies with the increase in the doping quantity of the element Lu, and this leads to apparent blue shift of spectrum emission, whereby phosphors with different photochromic properties can be obtained.

After the doping quantity of Lu increases to a certain amount, blue shift occurs in the emission spectrum of the inorganic compound as mentioned above; according to the theory that a blue chip emits white light after mixing of green phosphor with red phosphor by a certain ratio, it is obvious that the red part is absent in the above inorganic compound when it is merely doped with $Ce^{3+}$, but it has been found by test that red light at 570 nm and blue light at about 470 nm appear when the above inorganic compound is doped with $Dy^{3+}$, thus the combined doping of $Ce^{3+}$ and $Dy^{3+}$ apparently improves the light emission efficiency of the phosphor with the mere doping of $Ce^{3+}$.

According to test and research, when the content of the element R is too few, since the luminescence center is few, the brightness would be low; when the content of the element R is too high, concentration quenching would occur thereby leading to enhancement of non-radiative transition, so brightness would also be low, the activator is therefore preferably within the range of $0.1 \leq a \leq 0.5$; in order to obtain a white LED device having pure phase, excellent crystallization property, consistence in single crystal grains and forms, high emission efficiency and high color rendering index, the range is preferably $5.5 \leq x \leq 6.5$, more preferably $x=6$; $10.5 \leq y \leq 11.5$, more preferably $y=11$.

In yet another preferred example of the present application, the element M comprises elements Lu and La, preferably, a sum of mole numbers of the elements Lu and La is from 80 to 100% in the mole number of the element M. The element M simultaneously comprises elements Lu and La, controllable adjustment of the emission peak and the spectrum coverage can be achieved—for instance, with the increase in the Lu doping quantity, La content decreases, the emission spectrum gradually blue-shifts, and the emission color appears greener. The influence of the contents of the two to the emission color are relatively known to persons skilled in the art, so it is not explained here in detail.

The phosphor with the inorganic compound has a peak wavelength of excitation spectrum at 420 to 460 nm—a range broader than the emission spectrum of existing nitride phosphors, and more easily adjustable—and emits a peak wavelength covering the range between 515 to 540 nm, namely the range between green and yellowish green.

The aforementioned phosphor of the present application can be prepared by the method recited in the Background Art section, and preferably prepared by the method provided in the present application, which method comprises step 1)—using a simple substance, a nitride, an oxide selected from an element M, an element A, an element D and an element R or an alloy thereof as source materials, and mixing the source materials to obtain a mixture; step 2)—placing the mixture obtained by step 1) into a container and calcinating the same in nitrogen or other non-oxidizing conditions to obtain a calcinated product, wherein the highest sintering temperature is from 1500 to 2000° C., and the holding time is 5 to 20 hours; and step 3)—sequentially subjecting the calcinated product in step 2) to crushing, washing, sieving and baking processes to obtain the phosphor.

Source materials of the various elements are cheap, and the above preparing method is easily controllable in preparing conditions and simple in process, so it facilitates propagation and utilization of the phosphor according to the present application.

The source materials of the aforementioned various elements are weighted and taken according to mole ratios of the elements in the chemical formula $M_{3-a}A_xD_y:aR$.

In another typical example of the present application, there is provided a light emitting device comprising a fluorescent substance and an excitation light source, of which the fluorescent substance comprises the aforementioned phosphor. Since the phosphor according to the present application has high thermal stability and easy adjustability of emission spectrum, the light emitting device having the phosphor has high operating stability and longer use life, and is applicable to many different requirements.

In a preferred example of the present application, the excitation light source is a semiconductor light emitting diode or a laser light source, preferably, the excitation light source has an emission peak wavelength of 400 to 490 nm. Excitation bands of currently commercially available LED excitation light sources lie within the range, specifically, there are two types of excitation light sources: near ultra-violet diode with the wavelength range between 380 to 420 nm, and blue diode with the wavelength range between 420 to 490 nm. Moreover, the excitation peak wavelength of the aforementioned phosphor is about 440 nm, so the use of a light emitting diode within the above wavelength range facilitates photoluminescence of the phosphor.

In order to further improve the emission effect of the light emitting device, it is preferred that the fluorescent substance further comprises other phosphors selected from the group consisting of anyone or more of $(Y,Gd,Lu,Tb)_3(Al,Ga)_5O_{12}:Ce^{3+}$, $\beta$-SiAlON:$Eu^{2+}$, $(Ca,Sr)AlSiN_3:Eu^{2+}$, $(Li,Na,K)_2(Ti,Zr,Si,Ge)F_6:Mn^{4+}$ and $(Ca,Sr,Ba)MgAl_{10}O_{17}:Eu^{2+}$. The sign "," in between the various elements indicates that the element or elements within the parenthesis may be a single component or a solid solution comprising two or more elements—for instance, $(Ca,Sr)AlSiN_3:Eu^{2+}$ stands for one or more solid solutions in $CaAlSiN_3:Eu^{2+}$, $SrAlSiN_3:Eu^{2+}$ and $Ca_{1-x}Sr_xAlSiN_3:Eu^{2+}$ ($0<x<1$). Use of the phosphor according to the present application in cooperation with the aforementioned phosphors enables light emitting devices to emit white light with high emission efficiency, high color rendering index and low chromatic temperature, these white-light light emitting devices being applicable to the field of illumination or display.

Advantageous effects of the present application are explained in further detail below in conjunction with Examples and Comparative Examples.

Comparative Example 1

Basing on the stoichiometric proportion of the chemical formula $La_{2.7}Si_6N_{11}:0.3Ce^{3+}$, source materials of LaN (purity 99.9%), $Si_3N_4$ (purity 99.9%) and CeN (purity 99.99%) are precisely weighted, and mixed to form a mixed source material. The mixed source material is fully mixed and ground in a glove compartment for 30 minutes to obtain a mixture. The mixture is heated at a heating rate of 10° C./min to 1900° C., then held at 1900° C. for 10 hours, and subsequently naturally cooled to obtain a calcinated product. The calcinated product is taken out to be crushed, washed, sieved and baked to obtain $La_{2.7}Si_6N_{11}:0.3Ce^{3+}$ phosphor of Comparative Example 1.

Comparative Example 2

Basing on the stoichiometric proportion of the chemical formula $La_{2.86}Si_6N_{11}:0.14Ce^{3+}$, source materials of LaN (purity 99.9%), $Si_3N_4$ (purity 99.9%) and CeN (purity 99.99%) are precisely weighted, and mixed to form a mixed source material. The mixed source material is fully mixed and ground in a glove compartment for 30 minutes to obtain a mixture. The mixture is heated at a heating rate of 10° C./min to 1900° C., then held at 1900° C. for 10 hours, and subsequently naturally cooled to obtain a calcinated product.

The calcinated product is taken out to be crushed, washed, sieved and baked to obtain $La_{2.86}Si_6N_{11}:0.14Ce^{3+}$ phosphor of Comparative Example 2.

Example 1

Basing on the stoichiometric proportion of the chemical formula $La_2Lu_{0.85}Si_6N_{11}:0.15Ce^{3+}$, source materials of LuN (purity 99.9%), LaN (purity 99.9%), $Si_3N_4$ (purity 99.9%) and CeN (purity 99.99%) are precisely weighted, and mixed to form a mixed source material. The mixed source material is fully mixed and ground in a glove compartment for 30 minutes to obtain a mixture. The mixture is heated at a heating rate of 10° C./min to 1900° C., then held at 1900° C. for 10 hours, and subsequently naturally cooled to obtain a calcinated product. The calcinated product is taken out to be crushed, washed, sieved and baked to obtain $La_2Lu_{0.85}Si_6N_{11}:0.15Ce^{3+}$ phosphor of Example 1. The phosphor is subjected to X-ray scanning to arrive at FIG. 1, in which the Bragg angles scanned are 10 to 70°, and the scanning rate is 6°/min, the phosphor is subjected to fluorescence spectrum test, with excitation monitor wavelength as 525 nm, and emission monitor wavelength as 440 nm—see FIG. 2 for the monitor result.

Example 2

The $La_2Lu_{0.85}Si_6N_{11}:0.15Ce^{3+}$ obtained in Example 1 and a red fluorescent material $CaAlSiN_3:Eu^{2+}$ are mixed at a mass ratio of 30:70 and put in silica gel to form a sticky substance; the sticky substance is coated on a 460 nm blue LED chip to obtain a white-light LED device; the white-light LED device is tested, by a remote SIS-3_1.0 m steel photometric integrating sphere_R98, with drive current of 60 mA, to have a color rendering index of 82, and an emission efficiency of 160 1 m/W.

Example 3

Basing on the stoichiometric proportion of the chemical formula $La_{2.65}Lu_{0.05}Si_6N_{11}:0.3Ce^{3+}$, source materials of LuN (purity 99.9%), LaN (purity 99.9%), $Si_3N_4$ (purity 99.9%) and CeN (purity 99.99%) are precisely weighted, and mixed to form a mixed source material. The mixed source material is fully mixed and ground in a glove compartment for 30 minutes to obtain a mixture. The mixture is heated at a heating rate of 10° C./min to 1900° C., then held at 1900° C. for 10 hours, and subsequently naturally cooled to obtain a calcinated product. The calcinated product is taken out to be crushed, washed, sieved and baked to obtain $La_{2.65}Lu_{0.05}Si_6N_{11}:0.3Ce^{3+}$ phosphor of Example 3.

Example 4

Basing on the stoichiometric proportion of the chemical formula $La_{2.6}Lu_{0.1}Si_6N_{11}:0.3Ce^{3+}$, source materials of LuN (purity 99.9%), LaN (purity 99.9%), $Si_3N_4$ (purity 99.9%) and CeN (purity 99.99%) are precisely weighted, and mixed to form a mixed source material. The mixed source material is fully mixed and ground in a glove compartment for 30 minutes to obtain a mixture. The mixture is heated at a heating rate of 10° C./min to 1900° C., then held at 1900° C. for 10 hours, and subsequently naturally cooled to obtain a calcinated product. The calcinated product is taken out to be crushed, washed, sieved and baked to obtain $La_{2.6}Lu_{0.1}Si_6N_{11}:0.3Ce^{3+}$ phosphor of Example 4.

Example 5

Basing on the stoichiometric proportions of the chemical formulae $La_{2.6}Lu_{0.1}Si_6N_{11}:0.25Ce^{3+}$, $0.05Dy^{3+}$, source materials of LuN (purity 99.9%), LaN (purity 99.9%), $Si_3N_4$ (purity 99.9%) and CeN (purity 99.99%) are precisely weighted, and mixed to form a mixed source material. The mixed source material is fully mixed and ground in a glove compartment for 30 minutes to obtain a mixture. The mixture is heated at a heating rate of 10° C./min to 1900° C., then held at 1900° C. for 10 hours, and subsequently naturally cooled to obtain a calcinated product. The calcinated product is taken out to be crushed, washed, sieved and baked to obtain $La_{2.6}Lu_{0.1}Si_6N_{11}:0.25Ce^{3+}$, $0.05Dy^{3+}$ phosphor of Example 5.

Example 6

Basing on the stoichiometric proportion of the chemical formula $Lu_{1.43}La_{1.43}Si_6N_{11}:0.14Ce^{3+}$, source materials of LuN (purity 99.9%), LaN (purity 99.9%), $Si_3N_4$ (purity 99.9%) and CeN (purity 99.99%) are precisely weighted, and mixed to form a mixed source material. The mixed source material is fully mixed and ground in a glove compartment for 30 minutes to obtain a mixture. The mixture is heated at a heating rate of 10° C./min to 1900° C., then held at 1900° C. for 10 hours, and subsequently naturally cooled to obtain a calcinated product. The calcinated product is taken out to be crushed, washed, sieved and baked to obtain $Lu_{1.43}La_{1.43}Si_6N_{11}:0.14Ce^{3+}$ phosphor of Example 6.

Example 7

Basing on the stoichiometric proportion of the chemical formula $Lu_{1.144}La_{1.716}Si_6N_{11}:0.14Ce^{3+}$, source materials of LuN (purity 99.9%), LaN (purity 99.9%), $Si_3N_4$ (purity 99.9%) and CeN (purity 99.99%) are precisely weighted, and mixed to form a mixed source material. The mixed source material is fully mixed and ground in a glove compartment for 30 minutes to obtain a mixture. The mixture is heated at a heating rate of 10° C./min to 1900° C., then held at 1900° C. for 10 hours, and subsequently naturally cooled to obtain a calcinated product. The calcinated product is taken out to be crushed, washed, sieved and baked to obtain $Lu_{1.144}La_{1.716}Si_6N_{11}:0.14Ce^{3+}$ phosphor of Example 7.

Example 8

Basing on the stoichiometric proportion of the chemical formula $Lu_{1.001}La_{1.859}Si_6N_{11}:0.14Ce^{3+}$, source materials of LuN (purity 99.9%), LaN (purity 99.9%), $Si_3N_4$ (purity 99.9%) and CeN (purity 99.99%) are precisely weighted, and mixed to form a mixed source material. The mixed source material is fully mixed and ground in a glove compartment for 30 minutes to obtain a mixture. The mixture is heated at a heating rate of 10° C./min to 1900° C., then held at 1900° C. for 10 hours, and subsequently naturally cooled to obtain a calcinated product. The calcinated product is taken out to be crushed, washed, sieved and baked to obtain $Lu_{1.001}La_{1.859}Si_6N_{11}:0.14Ce^{3+}$ phosphor of Example 8.

Example 9

Basing on the stoichiometric proportion of the chemical formula $Lu_{0.572}La_{2.288}Si_6N_{11}:0.14Ce^{3+}$, source materials of LuN (purity 99.9%), LaN (purity 99.9%), $Si_3N_4$ (purity 99.9%) and CeN (purity 99.99%) are precisely weighted, and mixed to form a mixed source material. The mixed source material is fully mixed and ground in a glove compartment for 30 minutes to obtain a mixture. The mixture is heated at a heating rate of 10° C./min to 1900° C., then held at 1900° C. for 10 hours, and subsequently naturally cooled to obtain a calcinated product. The calcinated product is taken out to be crushed, washed, sieved and baked to obtain $Lu_{0.572}La_{2.288}Si_6N_{11}:0.14Ce^{3+}$ phosphor of Example 9.

Example 10

Basing on the stoichiometric proportion of the chemical formula $Lu_{0.429}La_{2.431}Si_6N_{11}:0.14Ce^{3+}$, source materials of LuN (purity 99.9%), LaN (purity 99.9%), $Si_3N_4$ (purity 99.9%) and CeN (purity 99.99%) are precisely weighted, and mixed to form a mixed source material. The mixed source material is fully mixed and ground in a glove compartment for 30 minutes to obtain a mixture. The mixture is heated at a heating rate of 10° C./min to 1900° C., then held at 1900° C. for 10 hours, and subsequently naturally cooled to obtain a calcinated product. The calcinated product is taken out to be crushed, washed, sieved and baked to obtain $Lu_{0.429}La_{2.431}Si_6N_{11}:0.14Ce^{3+}$ phosphor of Example 10.

Example 11

Basing on the stoichiometric proportion of the chemical formula $La_{2.8}Lu_{0.1}Si_{5.5}N_{10}O_{0.5}:0.1Ce^{3+}$, source materials of LuN (purity 99.9%), LaN (purity 99.9%), $Si_3N_4$ (purity 99.9%), CeN (purity 99.99%) and $SiO_2$ are precisely weighted, and mixed to form a mixed source material. The mixed source material is fully mixed and ground in a glove compartment for 30 minutes to obtain a mixture. The mixture is heated at a heating rate of 10° C./min to 1900° C., then held at 1900° C. for 10 hours, and subsequently naturally cooled to obtain a calcinated product. The calcinated product is taken out to be crushed, washed, sieved and baked to obtain $La_{2.8}Lu_{0.1}Si_{5.5}N_{10}O_{0.5}:0.1Ce^{3+}$ phosphor of Example 11.

Example 12

Basing on the stoichiometric proportion of the chemical formula $La_{2.73}Lu_{0.17}Si_{6.5}N_{11.67}:0.1Ce^{3+}$, source materials of LuN (purity 99.9%), LaN (purity 99.9%), $Si_3N_4$ (purity 99.9%) and CeN (purity 99.99%) are precisely weighted, and mixed to form a mixed source material. The mixed source material is fully mixed and ground in a glove compartment for 30 minutes to obtain a mixture. The mixture is heated at a heating rate of 10° C./min to 1900° C., then held at 1900° C. for 10 hours, and subsequently naturally cooled to obtain a calcinated product. The calcinated product is taken out to be crushed, washed, sieved and baked to obtain $La_{2.73}Lu_{0.17}Si_{6.5}N_{11.67}:0.1Ce^{3+}$ phosphor of Example 12.

Example 13

Basing on the stoichiometric proportion of the chemical formula $La_2Lu_{0.5}Si_6N_{11}:0.5Ce^{3+}$, source materials of LuN (purity 99.9%), LaN (purity 99.9%), $Si_3N_4$ (purity 99.9%) and CeN (purity 99.99%) are precisely weighted, and mixed to form a mixed source material. The mixed source material is fully mixed and ground in a glove compartment for 30 minutes to obtain a mixture. The mixture is heated at a heating rate of 10° C./min to 1900° C., then held at 1900° C. for 10 hours, and subsequently naturally cooled to obtain a calcinated product. The calcinated product is taken out to be crushed, washed, sieved and baked to obtain $La_2Lu_{0.5}Si_6N_{11}:0.5Ce^{3+}$ phosphor of Example 13.

Example 14

Basing on the stoichiometric proportion of the chemical formula $La_2Lu_{0.2}Si_{6.75}N_{12}:0.8Ce^{3+}$, source materials of LuN (purity 99.9%), LaN (purity 99.9%), $Si_3N_4$ (purity 99.9%) and CeN (purity 99.99%) are precisely weighted, and mixed to form a mixed source material. The mixed source material is fully mixed and ground in a glove compartment for 30 minutes to obtain a mixture. The mixture is heated at a heating rate of 10° C./min to 1900° C., then held at 1900° C. for 10 hours, and subsequently naturally cooled to obtain a calcinated product. The calcinated product is taken out to be crushed, washed, sieved and baked to obtain $La_2Lu_{0.2}Si_{6.75}N_{12}:0.8Ce^{3+}$ phosphor of Example 14.

Example 15

Basing on the stoichiometric proportion of the chemical formula $La_{2.66}Lu_{0.2}Si_5N_{9.67}:0.14Ce^{3+}$, source materials of LuN (purity 99.9%), LaN (purity 99.9%), $Si_3N_4$ (purity 99.9%) and CeN (purity 99.99%) are precisely weighted, and mixed to form a mixed source material. The mixed source material is fully mixed and ground in a glove compartment for 30 minutes to obtain a mixture. The mixture is heated at a heating rate of 10° C./min to 1900° C., then held at 1900° C. for 10 hours, and subsequently naturally cooled to obtain a calcinated product. The calcinated product is taken out to be crushed, washed, sieved and baked to obtain $La_{2.66}Lu_{0.2}Si_5N_{9.67}:0.14Ce^{3+}$ phosphor of Example 15.

Example 16

Basing on the stoichiometric proportion of the chemical formula $La_{2.56}Lu_{0.1}Si_7N_{12}:0.04Ce^{3+}$, source materials of LuN (purity 99.9%), LaN (purity 99.9%), $Si_3N_4$ (purity 99.9%) and CeN (purity 99.99%) are precisely weighted, and mixed to form a mixed source material. The mixed source material is fully mixed and ground in a glove compartment for 30 minutes to obtain a mixture. The mixture is heated at a heating rate of 10° C./min to 1900° C., then held at 1900° C. for 10 hours, and subsequently naturally cooled to obtain a calcinated product. The calcinated product is taken out to be crushed, washed, sieved and baked to obtain $La_{2.56}Lu_{0.1}Si_7N_{12}:0.04Ce^{3+}$ phosphor of Example 16.

Test results of emission peak wavelengths, external quantum efficiencies and packaging color rendering indices of the phosphors in the above Examples are shown in the following Table 1, in which quantum efficiencies are tested by a QE-2100 quantum efficiency meter, with $BaSO_4$ being selected as guide sample for comparison, and coloring indices are tested by HAAS2000.

TABLE 1

Proportional Compositions of Various Elements in Comparative Examples and Examples
(EPW stands for Emission Peak Wavelength; EQE stands for External
Quantum Efficiency; CRI stands for Color Rendering Index)

|  | M | R | D | a | x | y | EPW nm | EQE % | CRI |
|---|---|---|---|---|---|---|---|---|---|
| C. Example 1 | La | Ce | N | 0.3 | 6 | 11 | 540 | 88.2 | — |
| C. Example 2 | La | Ce | N | 0.14 | 6 | 11 | 535 | 98.6 | — |
| Example 1 | La + Lu | Ce | N | 0.15 | 6 | 11 | 513 | 72.5 | — |
| Example 2 | La + Lu | Ce | N | 0.15 | 6 | 11 | 512 | 73.6 | 82 |
| Example 3 | La + Lu | Ce | N | 0.3 | 6 | 11 | 538 | 93.4 | — |
| Example 4 | La + Lu | Ce | N | 0.3 | 6 | 11 | 534 | 78.1 | — |
| Example 5 | La + Lu | Ce + Dy | N | 0.3 | 6 | 11 | 533 | 77.6 | — |
| Example 6 | La + Lu | Ce | N | 0.14 | 6 | 11 | 515 | 53.8 | — |
| Example 7 | La + Lu | Ce | N | 0.14 | 6 | 11 | 520 | 57.2 | — |
| Example 8 | La + Lu | Ce | N | 0.14 | 6 | 11 | 523 | 59.1 | — |
| Example 9 | La + Lu | Ce | N | 0.14 | 6 | 11 | 530 | 63.8 | — |
| Example 10 | La + Lu | Ce | N | 0.14 | 6 | 11 | 532 | 71.9 | — |
| Example 11 | La + Lu | Ce | N + O | 0.1 | 5.5 | 10.5 | 524 | 80.4 | — |
| Example 12 | La + Lu | Ce | N | 0.1 | 6.5 | 11.67 | 526 | 73.6 | — |
| Example 13 | La + Lu | Ce | N | 0.5 | 6 | 11 | 536 | 68.2 | — |
| Example 14 | La + Lu | Ce | N | 0.8 | 6.75 | 12 | 540 | 54.5 | — |
| Example 15 | La + Lu | Ce | N | 0.14 | 5 | 9.67 | 538 | 57.4 | — |
| Example 16 | La + Lu | Ce | N | 0.04 | 7 | 12 | 520 | 64.9 | — |

As should be pointed out here, a, x, y respectively stand for stoichiometric ratios corresponding to different elements in the specific molecular formulae of the samples in the various Examples.

As can be seen from the above test data, with the increase in the content of the Lu element, blue shift or red shift of the emission spectrum of the phosphor is increasingly apparent.

Moreover, the X-ray scanning results of the phosphors specified in the above Examples 2 through 16 all show the same diffraction peak peaking positions and similar strengths as those in FIG. 1, that is to say, it can be judged that they have the same crystal structure as $La_3Si_6N_{11}$.

As can be seen from the above description, the aforementioned Examples of the present invention achieve the following technical effects: since the ionic radius of $Lu^{3+}$ is smaller than that of $La^{3+}$, when the inorganic compound forming the phosphor comprises element Lu, the original ligand site would be contracted; in order to reduce lattice distortion due to the ligand site contraction, the adjacent ligand site expands, and this weakens the crystal field environment surrounding activator ions Ce, so that the emission spectrum of the phosphor having the inorganic compound can be easily adjusted—even adjusted to the green light region, and therefore its photochromic property can be flexibly adjusted according to needs; furthermore, its thermal stability is relatively good to the extent that the need for high-density energy excitation can be satisfied.

When the element R is Ce in the inorganic compound, activator ions $Ce^{3+}$ in $La_3Si_6N_{11}$ mostly substitute $La_2$ lattice sites, while $La_1$ lattice sites adjacent $La_2$ are less substituted—in other words, there is a phenomenon that $Ce^{3+}$ has preferential site occupation in the matrix; $La_1$ and $La_2$ have relatively similar coordination environments, as both are joined with 8 Ns, and their average bond lengths are nearly the same, with the atomic ratio $La_1:La_2=2:1$ in a single cell; since the atomic quantities of $La_1$ are by far greater than those of $La_2$, after $Lu^{3+}$ with short ionic radii substitute partial $La^{3+}$, $Lu^{3+}$ mainly substitute $La_1$, however, since the difference in ionic radii, the ligand site of $La_1$ would contract; in order to reduce lattice distortion as far as possible, the adjacent $La_2$ ligand site expands; concerning the expanding $La_2$ ligand site, since $Ce^{3+}$ mainly occupy $La_2$ lattice sites, ligands adjacent $Ce^{3+}$ ions also expand, which weakens the adjacent crystal field environment, and this finally leads to weakening of 5d energy level splitting of $Ce^{3+}$, so that the spectrum of the inorganic compound varies with variation of the doping quantity of Lu, whereby the spectrum of the above-structured inorganic compound is easily adjustable, so as to achieve adjustment of the photochromic property. At the same time, the 5d energy level splitting of $Ce^{3+}$ linearly varies with the increase in the doping quantity of the element Lu, and this leads to apparent blue shift of spectrum emission, whereby phosphors with different photochromic properties can be obtained.

What the above recited are merely preferred examples of the present invention, and they are not meant to restrict the present invention, as persons skilled in the art may make various modifications and variations to the present invention. Any amendment, equivalent substitution or improvement made within the spirit and principle of the present invention shall all be covered within the protection scope of the present invention.

What is claimed is:

1. A phosphor, comprising an inorganic compound, characterized in that the inorganic compound at least comprises an element M, an element A, an element D, and an element R, of which the element M is one or two elements selected from the group consisting of Lu, La, Pr, Nd, Sm, Y, Tb, and Gd and must comprise Lu; the element A is Si and/or Ge; the element D is one or two elements selected from the group consisting of O, N, and F and must comprise N; the element R is Ce and/or Dy;

the element Lu has a mole ratio of 1 to 50% in the element M, and that the inorganic compound has a crystal structure the same as $La_3Si_6N_{11}$;
the phosphor has a peak wavelength of excitation spectrum at 420 to 460 nm, and can emit a peak wavelength covering the range between 515 to 540 nm.

2. The phosphor according to claim 1, wherein the inorganic compound has a composition of $M_{3-a}A_xD_y:aR$, wherein parameters a, x and y satisfy the following conditions: $0 < a \leq 0.8$, $5 \leq x \leq 7$, and $10 \leq y \leq 12$.

3. The phosphor according to claim 2, wherein the element Lu has a mole ratio of 1 to 40% in the element M.

4. The phosphor according to claim 2, wherein the element A is Si.

5. The phosphor according to claim 2, wherein the element D is N.

6. The phosphor according to claim 2, wherein the element R is Ce or a combination of Ce with Dy.

7. The phosphor according to claim 6, wherein $0.1 \leq a \leq 0.5$; $5.5 \leq x \leq 6.5$; and $10.5 \leq y \leq 11.5$.

8. The phosphor according to claim 7, wherein the element M comprises elements Lu and La, a sum of mole numbers of the elements Lu and La is from 80 to 100% in the mole number of the element M.

9. A light emitting device, comprising a fluorescent substance and an excitation light source, wherein the fluorescent substance comprises the phosphor according to claim 1.

10. The light emitting device according to claim 9, wherein the excitation light source is a semiconductor light emitting diode or a laser light source, preferably, the excitation light source has an emission peak wavelength of 400 to 490 nm.

11. The light emitting device according to claim 9, wherein the fluorescent substance further comprises another/other phosphor(s) selected from the group consisting of any one or more of $(Y,Gd,Lu,Tb)_3(Al,Ga)_5O_{12}:Ce^{3+}$, $\beta$-SiAlON:$Eu^{2+}$, $(Ca,Sr)AlSiN_3:Eu^{2+}$, $(Li,Na,K)_2(Ti,Zr,Si,Ge)F_6:Mn^{4+}$ and $(Ca,Sr,Ba)MgAl_{10}O_{17}:Eu^{2+}$.

12. A method for preparing the phosphor according to claim 1, comprising:

step 1)—using a simple substance, a nitride, an oxide selected from an element M, an element A, an element D and an element R or an alloy thereof as source materials, and mixing the source materials to obtain a mixture;

step 2)—placing the mixture into a container and calcinating the same in nitrogen or other non-oxidizing conditions to obtain a calcinated product, wherein the highest sintering temperature is from 1500 to 2000° C., and the holding time is 5 to 20 hours; and step 3)—sequentially subjecting the calcinated product to crushing, washing, and sieving processes to obtain the phosphor.

13. The preparing method according to claim 12, wherein the source materials of the elements are weighted and taken according to mole ratios of the elements in the chemical formula $M_{3-a}A_xD_y:aR$.

* * * * *